(12) United States Patent
Shimada

(10) Patent No.: US 6,350,137 B1
(45) Date of Patent: Feb. 26, 2002

(54) IC SOCKET AND CONTACT PINS FOR IC SOCKET

(75) Inventor: Hideo Shimada, Iwatshuki (JP)

(73) Assignee: Enplas Corporation (JP)

(*) Notice: Subject to any disclaimer, the term of this patent is extended or adjusted under 35 U.S.C. 154(b) by 0 days.

(21) Appl. No.: 09/450,915

(22) Filed: Nov. 29, 1999

(30) Foreign Application Priority Data

Nov. 30, 1998 (JP) .......................................... 10-355324

(51) Int. Cl.$^7$ .............................................. H01R 11/22
(52) U.S. Cl. ......................................... 439/266; 439/70
(58) Field of Search ........................... 439/266, 70, 71, 439/72, 73, 64, 259, 260, 261, 262, 263, 264, 265

(56) References Cited

U.S. PATENT DOCUMENTS 5,443,396 A * 8/1995 Tokushige .................. 439/266
5,713,751 A * 2/1998 Fukunaga .................... 439/266

* cited by examiner

*Primary Examiner*—Gary Paumen
*Assistant Examiner*—Alexander Gilman
(74) *Attorney, Agent, or Firm*—Bachman & LaPointe, P.C.

(57) ABSTRACT

A first contact portion of each contact pin is positioned by a pin support portion formed on a socket main body of an IC socket. The first contact portion has a positioning step portion, which is engaged with a lead 16 of an IC, formed thereon. The positioning step portion has a first positioning surface and a second positioning surface. Then, the first positioning surface supports one of lead portion of the lead, and the second positioning surface is engaged with an outer side surface of another lead portion to have a slight space. This allows the IC to be positioned and supported at a predetermined position of the IC socket.

20 Claims, 12 Drawing Sheets

IC SOCKET AND CONTACT PINS FOR IC SOCKET

BACKGROUND OF THE INVENTION

1. Field of the Invention

The present invention relates to contact pins for connecting IC-side leads to an external circuit board and an IC socket having a plurality of contact pins in order to perform an electrical test of IC, and more specifically to contact pins in which accuracy in an IC support position is improved and an IC socket.

2. Description of the Related Art

As shown in FIG. 14, an IC socket 100 of an open top type has a plurality of contact pins 101, which connects IC (e.g., QFP, SOP, TSOP) leads (not shown) to an external electrical test circuit (not shown) attached to a socket main body 102. In the socket main body 102, a cover 104, which has an IC insertion window 103, is supported to be movable up and down.

Then, when the cover 104 is depressed, the contact pins 101 shown in FIG. 14 are bent and deformed, so that the movable side pin 105 is depressed by the cover 104, a movable side contact portion 106 retracts from a fixed side pin 107 and an IC lead is guided onto the fixed side pin 107. Also, when the cover 101 returns to the original position, contact pins 101 press a lead 111 of an IC 110 to a fixed side contact portion 108 of the fixed side pin 107 by a restoring force, so that the lead 111 of IC 110 is sandwiched between the movable side contact section 106 and the fixed side contact portion 108 (see FIG. 15). Under this state, current-carrying to the lead 111 of IC 110 is established, and an electrical test of IC 110 is carried out.

When the electrical test of IC 110 ends, the cover 104 is depressed and the movable side contact portion 106 is retracted from the fixed side contact portion 108, and IC 110 is taken out of the IC socket 100.

In such IC socket 100, the tip of the lead 111 is brought into contact with the tip of a rib 112 of the socket main body 102, which divides the contact pins 101 so as to position IC 110 as shown in FIG. 16 in order that the above-mentioned electrical test is performed without fail. Thereafter, the lead 111 is sandwiched between the fixed side contact portion 108 and the movable side contact portion 106.

However, in the above-explained conventional IC socket, the pitch between leads is narrow. If the width of lead 111 has to be the same as that of the contact pin 101 or smaller than that of the contact pin 101, there occurs a case in which the tip of the lead 111 comes in a contact pint containing groove 113 formed between ribs 112, 112, with the result that IC 110 cannot be correctly positioned. This makes it difficult to sandwich the lead 111 between the side contact portion 108 and the movable side contact portion 106.

In order to avoid the above-mentioned disadvantages, as shown in FIG. 18(a), a positioning projection 114, which is formed on the socket main body 102, is brought into contact with the side surface of resin mold 115 so as to position IC 110. However, as shown in FIG. 18(b), if IC 110 is inserted in an inverted position, the side surface of resin mold 115 to be positioned is not present in the socket main body 102, so that the positioning of IC 110 cannot be carried out.

In connection with the IC socket of a clamshell type, there is proposed the technique in which a tip 121 of a contact pin 120 is engaged with a bend portion 122 of the lead 111 of IC 110 so as to position IC 110 as shown in FIG. 19 (for example, Unexamined Japanese Patent Publication Sho No. 63-25476, Unexamined Japanese Utility Model Publication Sho No. 63-25477). However, in such inventions, as shown in FIG. 20, the tip 121 of the contact pin 120 is not positioned to the socket main body 102. If the IC 110 is depressed by a cover 123, the contact pin 120 is bent and deformed, so that the position where the contact pin 120 and the lead 111 are contacted is shifted. As a result, there is a case in which the correct positioning of IC 110 cannot be expected.

Moreover, in connection with the IC socket of clamshell type, there is proposed the technique in which the lower surface of lead 111 and a side surface of resin mold 115 are supported by a pogo pin 130, which slides in up and down directions in the figure, allowing IC 110 to be positioned at a predetermined position of the socket main body 102 (Unexamined Japanese Patent Publication Hei No. 4-178574). However, according to such conventional structure, a movable portion 131 of the pogo pin 130 is mated with an engaging hole 133 of a fixing portion 132 of a movable portion 131 of the pogo pin 130. Further, the movable portion 131 of pogo pin 130 is elastically supported by a spring 134 attached in the engaging hole 133. For this reason, there is a limitation in a reduction in size of the pogo pin 130. Such structure cannot be applied to such IC 110 in which the pitch between leads 111 is narrow and the width of lead 111 is small as the present invention aims. Also, in such prior art, there is a problem in which the structure of pogo pin 130 is complicated and IC socket 100 becomes expensive. Further, in such prior art, there is a possibility that the movable portion 131 will rattle and fall down since a mate space is formed between the movable portion 131 of pogo pin 130 and the fixing portion 132. For this reason, high accurate positioning of IC 110 cannot be expected.

SUMMARY OF THE INVENTION

It is an object of the present invention to provide an IC socket, which can accurately position and support an IC with relatively a simple structure, and contact pins for use in the IC socket.

The invention of the first aspect is an IC socket comprising a socket main body for elastically supporting a cover having an IC insertion window formed thereon to be movable up and down; and a plurality of contact pins, which are attached to the socket main body, for connecting gull-wing shaped leads taken out of a side surface of an IC resin mold to an external electrical test circuit. Each of the contact pins comprises a base portion fixed to said socket main body; a first contact portion, which is extended from the base portion, for supporting the lead in a state that it is positioned by a pin support portion formed on the socket main body; and a second contact portion, which is connected to the base portion through a spring portion, for bending and deforming the spring portion by being pressed by the cover when the cover is depressed, and for guiding the IC lead onto the first contact portion after retracting from the first contact portion, and for sandwiching the lead between the first contact portion and the second contact portion by an elastic restoring force of the spring portion when the cover returns to an original position, whereby performing an electrical connection. A positioning step portion, which is engaged with the lead to position the IC, is formed on the first contact portion.

According to the invention of the first aspect, since the first contact portion of each contact pin, which supports the lead, is positioned by the pin support portion of the socket main body, the positioning step portion formed on the first contact portion is correctly positioned to the socket main body. Therefore, in the invention of the first aspect, when IC is inserted from the IC insertion window after the cover is depressed and the second contact portion is retracted from the first contact portion, the IC lead is engaged with the first positioning step portion of the first contact portion and IC is correctly positioned at a predetermined position of the IC socket. Thereafter, when the cover is returned to the original IC lead is surely sandwiched between the first contact portion of the contact pin and the second contact portion and the electrical test of IC can be correctly performed.

The invention of the second aspect is an IC socket comprising: a socket main body for elastically supporting a cover having an IC insertion window formed thereon to be movable up and down; and a plurality of contact pins, which are attached to the socket main body, for connecting gull-wing shaped leads taken out of a side surface of an IC resin mold to an external electrical test circuit. Each of the contact pins comprises a base portion fixed to the socket main body; a first contact portion, which is connected to the base portion through a first spring portion, for supporting the lead; and a second contact portion, which is connected to the base portion through a second spring portion, for bending and deforming the second spring portion by being pressed by the cover when the cover is depressed, and for guiding the IC lead onto the first contact portion after retracting from the first contact portion, and for sandwiching the lead between the first contact portion and the second contact portion by an elastic restoring force of the second spring portion when the cover returns to an original position, whereby performing an electrical connection. A pin support portion, which comes in contact with the first contact portion urged by a spring force of the first spring portion to position the first contact portion, is formed on the socket main body, and a positioning step portion, which is engaged with the lead to position the IC, is formed on the first contact portion.

According to the invention of the second aspect, since the first contact portion of each contact pin, which supports the lead, is pressed to the pin support portion of the socket main body by an elastic force of the first spring portion and the first contact portion is positioned by the pin support portion of the socket main body, the positioning step portion formed on the first contact portion is correctly positioned to the socket main body. Therefore, in the invention of the second aspect, when IC is inserted from the IC insertion window after the cover is depressed and the second contact portion is retracted from the first contact portion, the lead of IC is engaged with the first positioning step portion of the first contact portion and IC is correctly positioned at a predetermined position of the IC socket. Thereafter, when the cover is returned to the original position, the IC lead is surely sandwiched between the first contact portion of the contact pin and the second contact portion and the electrical test of IC can be correctly performed.

The invention of the third aspect is an IC socket comprising: a socket main body for elastically supporting a cover having an IC insertion window formed thereon to be movable up and down; and a plurality of contact pins, which are attached to the socket main body, for connecting gull-wing shaped leads taken out of a side surface of a resin mold of IC to an external electrical test circuit. Each contact pin comprises a base portion fixed to the socket main body; a first contact portion, which is extended from the base portion, for supporting the lead in a state that it is positioned by a pin support portion formed on the socket main body; and a second contact portion, which is connected to the base portion through a spring portion, for bending and deforming the spring portion by being pressed by the cover when the cover is depressed, and for guiding the IC lead onto the first contact portion after retracting from the first contact portion, and for sandwiching the lead between the first contact portion and the second contact portion by an elastic restoring force of the spring portion when the cover returns to an original position, whereby performing an electrical connection. A positioning step portion, which is engaged with the lead and the side surface of the resin mold to position the IC, is formed on the first contact portion.

According to the invention of the third aspect, since the first contact portion of each contact pin, which supports the lead, is positioned by the pin support portion of the socket main body, the positioning step portion formed on the first contact portion is correctly positioned to the socket main body. Therefore, in the invention of the third aspect, when IC is inserted from the IC insertion window after the cover is depressed and the second contact portion is retracted from the first contact portion, the IC lead and the side surface of the resin mold are engaged with the first positioning step portion of the first contact portion and IC is correctly positioned at a predetermined position of the IC socket. Thereafter, when the cover is returned to the original position, the IC lead is surely sandwiched between the first contact portion of the contact pin and the second contact portion and the electrical test of IC can be correctly performed.

The invention of the fourth aspect is an IC socket comprising: a socket main body for elastically supporting a cover having an IC insertion window formed thereon to be movable up and down; and a plurality of contact pins, which are attached to the socket main body, for connecting gal-wing shaped leads taken out of a side surface of an IC resin mold to an external electrical test circuit. Each contact pin comprises a base portion fixed to the socket main body; a first contact portion, which is connected to the base portion through a first spring portion, for supporting the lead; and a second contact portion, which is connected to the base portion through a second spring portion, for bending and deforming the second spring portion by being pressed by the cover when the cover is depressed, and for guiding the IC lead onto the first contact portion after retracting from the first contact portion, and for sandwiching the lead between the first contact portion and the second contact portion by an elastic restoring force of the second spring portion when the cover returns to an original position, whereby performing an electrical connection. A pin support portion, which comes in contact with the first contact portion urged by a spring force of the first spring portion to position the first contact portion, is formed on the socket main body, and a positioning step portion, which is engaged with the lead and the side surface of the resin mold to position the IC, is formed on the first contact portion.

According to the invention of the fourth aspect, since the first contact portion of each contact pin, which supports the lead, is pressed to the pin support portion of the socket main body by an elastic force of the first spring portion and the first contact portion is positioned by the pin support portion of the socket main body, the positioning step portion formed on the first contact portion is correctly positioned to the socket main body. Therefore, in the invention of the fourth aspect, when IC is inserted from the IC insertion window after the cover is depressed and the second contact portion is retracted from the first contact portion, the IC lead and the side surface of the resin mold are engaged with the first positioning step portion of the first contact portion and IC is correctly positioned at a predetermined position of the IC socket. Thereafter, when the cover is returned to the original position, the IC lead is surely sandwiched between the first contact portion of the contact pin and the second contact portion and the electrical test of IC can be correctly performed.

The invention of the fifth aspect is that, in the invention of the first aspect, the lead has a first lead portion, which projects substantially horizontally from the side surface of the resin mold, a second lead portion, which is bent from the first lead portion, and a third lead portion, which is bent substantially horizontally from the second lead portion. Then, the positioning step portion has a first positioning surface, which supports the third lead portion, and a second positioning surface, which is engaged with the outer side surface of the second lead portion.

According to the invention of the fifth aspect, when the IC lead is engaged with the positioning step portion of the first contact portion positioned with respect to the socket main body, the first positioning surface of the positioning step portion supports the third IC lead portion, and the second positioning surface of the positioning step portion is engaged with the outer surface of the second lead portion of IC. As a result, IC is correctly positioned and supported at the predetermined position of the IC socket.

The invention of the sixth aspect is that, in the invention of the second aspect, the lead has a first lead portion, which projects substantially horizontally from the side surface of the resin mold, a second lead portion, which is bent from the first lead portion, and a third lead portion, which is bent substantially horizontally from the second lead portion. The positioning step portion has a first positioning surface, which supports the third lead portion, and a second positioning surface, which is engaged with the outer side surface of the second lead portion.

According to the invention of the sixth aspect, when the IC lead is engaged with the positioning step portion of the first contact portion positioned with respect to the socket main body, the first positioning surface of the positioning step portion supports the third IC lead portion, and the second positioning surface of the positioning step portion is engaged with the outer surface of the second IC lead portion. As a result, IC is correctly positioned and supported at the predetermined position of the IC socket.

The invention of the seventh aspect is that in the invention of the first aspect, the lead has a first lead portion, which projects substantially horizontally from the side surface of the resin mold, a second lead portion, which is bent from the first lead portion, and a third lead portion, which is bent substantially horizontally from the second lead portion. The positioning step portion has a first positioning surface, which supports the third lead portion, and a second positioning surface, which is engaged with the inner side surface of the second lead portion.

According to the invention of the seventh aspect, when the IC lead is engaged with the positioning step portion of the first contact portion positioned with respect to the socket main body, the first positioning surface of the positioning step portion supports the third IC lead portion, and the second positioning surface of the positioning step portion is engaged with the inner surface of the second IC lead portion. As a result, IC is correctly positioned and supported at the predetermined position of the IC socket.

The invention of eighth aspect is that in the invention of the second aspect, the lead has a first lead portion, which projects substantially horizontally from the side surface of the resin mold, a second lead portion, which is bent from the first lead portion, and a third lead portion, which is bent substantially horizontally from the second lead portion. The positioning step portion has a first positioning surface, which supports the third lead portion, and a second positioning surface, which is engaged with the inner side surface of the second lead portion.

According to the invention of the eighth aspect, when the IC lead is engaged with the positioning step portion of the first contact portion positioned with respect to the socket main body, the first positioning surface of the positioning step portion supports the third IC lead portion, and the second positioning surface of the positioning step portion is engaged with the inner surface of the second lead portion of IC. As a result, IC is correctly positioned and supported at the predetermined position of the IC socket.

The invention of the ninth aspect is that in the invention of the first aspect, the lead has a first lead portion, which projects substantially horizontally from the side surface of the resin mold, a second lead portion, which is bent from the first lead portion, and a third lead portion, which is bent substantially horizontally from the second lead portion. The positioning step portion has a first positioning surface, which supports the third lead portion, and a second positioning surface, which is engaged with the tip surface of third lead portion.

According to the invention of the ninth aspect, when the IC lead is engaged with the positioning step portion of the first contact portion positioned with respect to the socket main body, the first positioning surface of the positioning step portion supports the third IC lead portion, and the second positioning surface of the positioning step portion is engaged with the tip surface of the third IC lead portion. As a result, IC is correctly positioned and supported at the predetermined position of the IC socket.

The invention of the tenth aspect is that in the invention of claim 2 or 2, the lead has a first lead portion, which projects substantially horizontally from the side surface of the resin mold, a second lead portion, which is bent from the first lead portion, and a third lead portion, which is bent substantially horizontally from the second lead portion. The positioning step portion has a first positioning surface, which supports the third lead portion, and a second positioning surface, which is engaged with the tip surface of third lead portion.

According to the invention of the tenth aspect, when the IC lead is engaged with the positioning step portion of the first contact portion positioned with respect to the socket main body, the first positioning surface of the positioning step portion supports the third IC lead portion, and the second positioning surface of the positioning step portion is engaged with the tip surface of the third IC lead portion. As a result, IC is correctly positioned and supported at the predetermined position of the IC socket.

The invention of the eleventh aspect is that in the invention of the third aspect, the lead has a first lead portion, which projects substantially horizontally from the side surface of the resin mold, a second lead portion, which is bent from the first lead portion, and a third lead portion, which is bent substantially horizontally from the second lead portion, and the positioning step portion has a first positioning surface, which supports the third lead portion, and a second positioning surface, which is engaged with the side surface of the resin mold.

According to the invention of the eleventh aspect, when the IC lead is engaged with the positioning step portion of the first contact portion positioned with respect to the socket main body, the first positioning surface of the positioning step portion supports the third lead portion of IC, and the second positioning surface of the positioning step portion is engaged with the side surface of the IC resin mold. As a result, IC is correctly positioned and supported at the predetermined position of the IC socket.

The invention of the twelfth aspect is that in the invention of the fourth aspect, the lead has a first lead portion, which projects substantially horizontally from the side surface of the resin mold, a second lead portion, which is bent from the first lead portion, and a third lead portion, which is bent substantially horizontally from the second lead portion, and the positioning step portion has a first positioning surface, which supports the third lead portion, and a second positioning surface, which is engaged with the side surface of the resin mold.

According to the invention of the twelfth aspect, when the IC lead is engaged with the positioning step portion of the first contact portion positioned with respect to the socket main body, the first positioning surface of the positioning step portion supports the third lead IC portion, and the second positioning surface of the positioning step portion is engaged with the side surface of the IC resin mold. As a result, IC is correctly positioned and supported at the predetermined position of the IC socket.

The invention of the thirteenth aspect is IC socket contact pins, which are attached to a socket main body, which elastically supports a cover having an IC insertion window formed thereon to be movable up and down, for connecting gal-wing shaped leads taken out of a side surface of a IC resin mold to an external electrical test circuit. Each contact pin comprises a base portion fixed to the socket main body; a first contact portion, which is extended from the base portion, for supporting the lead in a state that it is positioned by a pin support portion formed on the socket main body; and a second contact portion, which is connected to the base portion through a spring portion, for bending and deforming the spring portion by being pressed by the cover when the cover is depressed, and for guiding the IC lead onto the first contact portion after retracting from the first contact portion, and for sandwiching the lead between the first contact portion and the second contact portion by an elastic restoring force of the spring portion when the cover returns to an original position, whereby performing an electrical connection. A positioning step portion, which is engaged with the lead to position the IC, is formed on the first contact portion.

The invention of the fourteenth aspect is IC socket contact pins, which are attached to a socket main body, which elastically supports a cover having an IC insertion window formed thereon to be movable up and down, for connecting gull-wing shaped leads taken out of a side surface of a IC resin mold to an external electrical test circuit. Each contact pin comprises a base portion fixed to the socket main body; a first contact portion, which is connected to the base portion through a first spring portion and which is pressed to a pin support portion formed on the socket main body by a spring force of the first spring portion so as to be positioned, for supporting the lead; and a second contact portion, which is connected to the base portion through a second spring portion, for bending and deforming the second spring portion by being pressed by the cover when the cover is depressed, and for guiding the IC lead onto the first contact portion after retracting from the first contact portion, and for sandwiching the lead between the first contact portion and the second contact portion by an elastic restoring force of the second spring portion when the cover returns to an original position, whereby performing an electrical connection. A positioning step portion, which is engaged with the lead to position the IC, is formed on the first contact portion.

The invention of the fifteenth aspect is IC socket contact pins, which are attached to a socket main body, which elastically supports a cover having an IC insertion window formed thereon to be movable up and down, for connecting gal-wing shaped leads taken out of a side surface of an IC resin mold to an external electrical test circuit. Each contact pin comprises a base portion fixed to the socket main body; a first contact portion, which is extended from the base portion, for supporting the lead in a state that it is positioned by a pin support portion formed on the socket main body; and a second contact portion, which is connected to the base portion through a spring portion, for bending and deforming the spring portion by being pressed by the cover when the cover is depressed, and for guiding the IC lead onto the first contact portion after retracting from the first contact portion, and for sandwiching the lead between the first contact portion and the second contact portion by an elastic restoring force of the spring portion when the cover returns to an original position, whereby performing an electrical connection. A positioning step portion, which is engaged with the lead and the side surface of the resin mold to position the IC, is formed on the first contact portion.

The invention of the sixteenth aspect is IC socket contact pins, which are attached to a socket main body, which elastically supports a cover having an IC insertion window formed thereon to be movable up and down, for connecting gal-wing shaped leads taken out of a side surface of an IC resin mold to an external electrical test circuit. Each contact pin comprises a base portion fixed to said socket main body; a first contact portion, which is connected to said base portion through a first spring portion and which is pressed to a pin support portion formed on said socket main body by a spring force of said first spring portion so as to be positioned, for supporting said lead; and a second contact portion, which is connected to said base portion through a second spring portion, for bending and deforming said second spring portion by being pressed by said cover when said cover is depressed, and for guiding said IC lead onto said first contact portion after retracting from said first contact portion, and for sandwiching said lead between said first contact portion and said second contact portion by an elastic restoring force of said second spring portion when said cover returns to an original position, whereby performing an electrical connection. A positioning step portion, which is engaged with said lead and the side surface of said resin mold to position said IC, is formed on said first contact portion.

BRIEF DESCRIPTION OF THE DRAWINGS

FIGS. 16(*a*) is a front view, and 16(*b*) is a view in an A direction of FIG. 16(*a*);

FIGS. 17(*a*) is a front view, and 17(*b*) is a view in a B direction of FIG. 17(*a*);

FIG. 18(*a*) is a front view showing a first example of IC, and FIG. 18(*b*) is a front view showing a second example of IC;

DETAILED DESCRIPTION OF THE PREFERRED EMBODIMENTS

Embodiments of the present invention will be described with reference to the drawings accompanying herewith.

(First embodiment)

Figure 1:
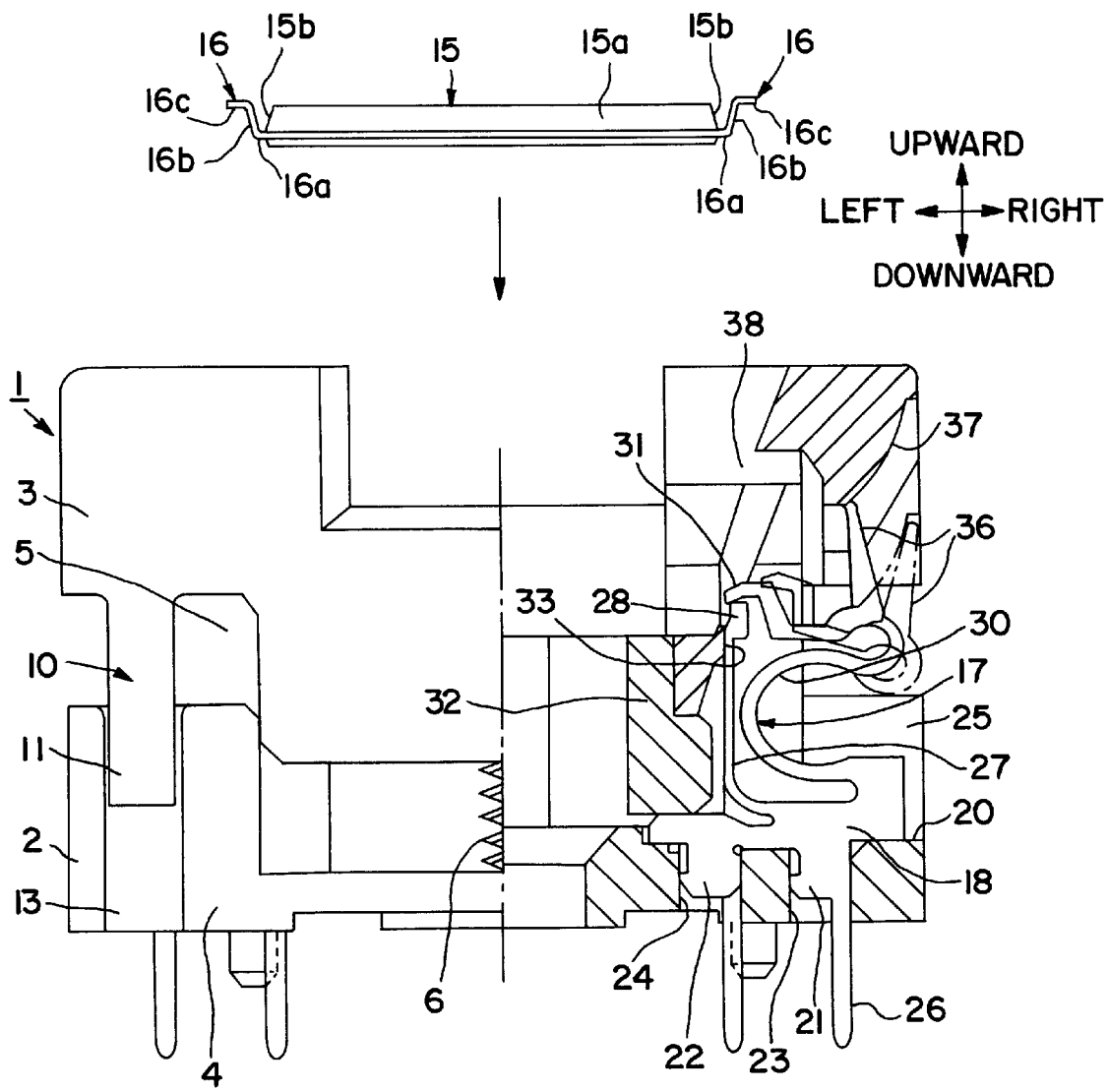
FIG. 1 is a front view, taken a right half in cross section, of an IC socket according to a first embodiment of the present invention.
Figure 2:
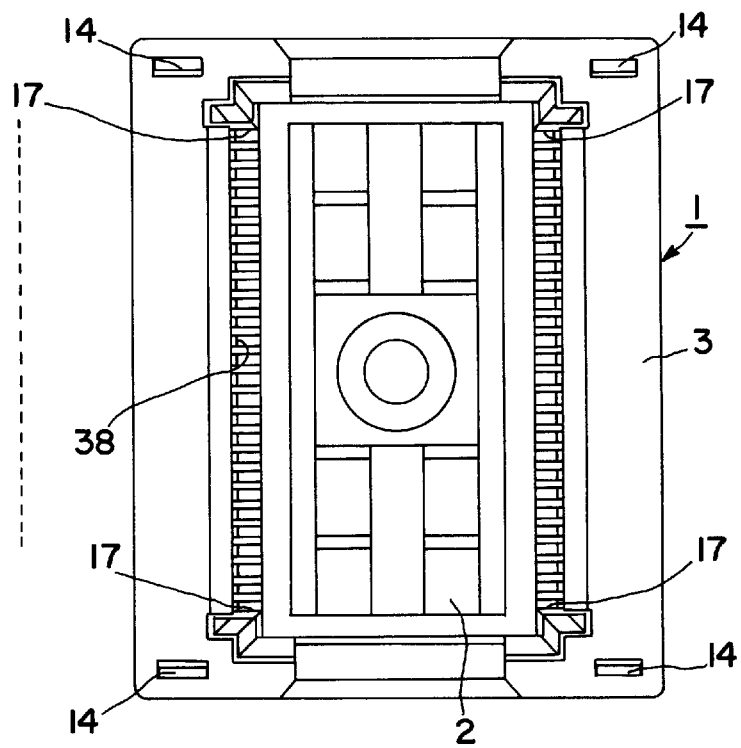
FIG. 2 is a plan view of the IC socket of FIG. 1.

FIG. 1 is a cross sectional view of an IC socket 1 showing an embodiment of the present invention. FIG. 2 is a plan view of the IC socket of FIG. 1.

As shown in these figures, a cover 3 is incorporated into a socket main body 2 to be movable up and down. More specifically, a cover guide 4 is formed on the socket main body 2, and a guide groove 5, which is slidably engaged with the cover guide 4. The cover 3 is guided to the cover guide 4 of the socket main body 2 to be movable up and down. The socket main body 2 and cover 3 are formed of insulating resin material.

Figure 4:
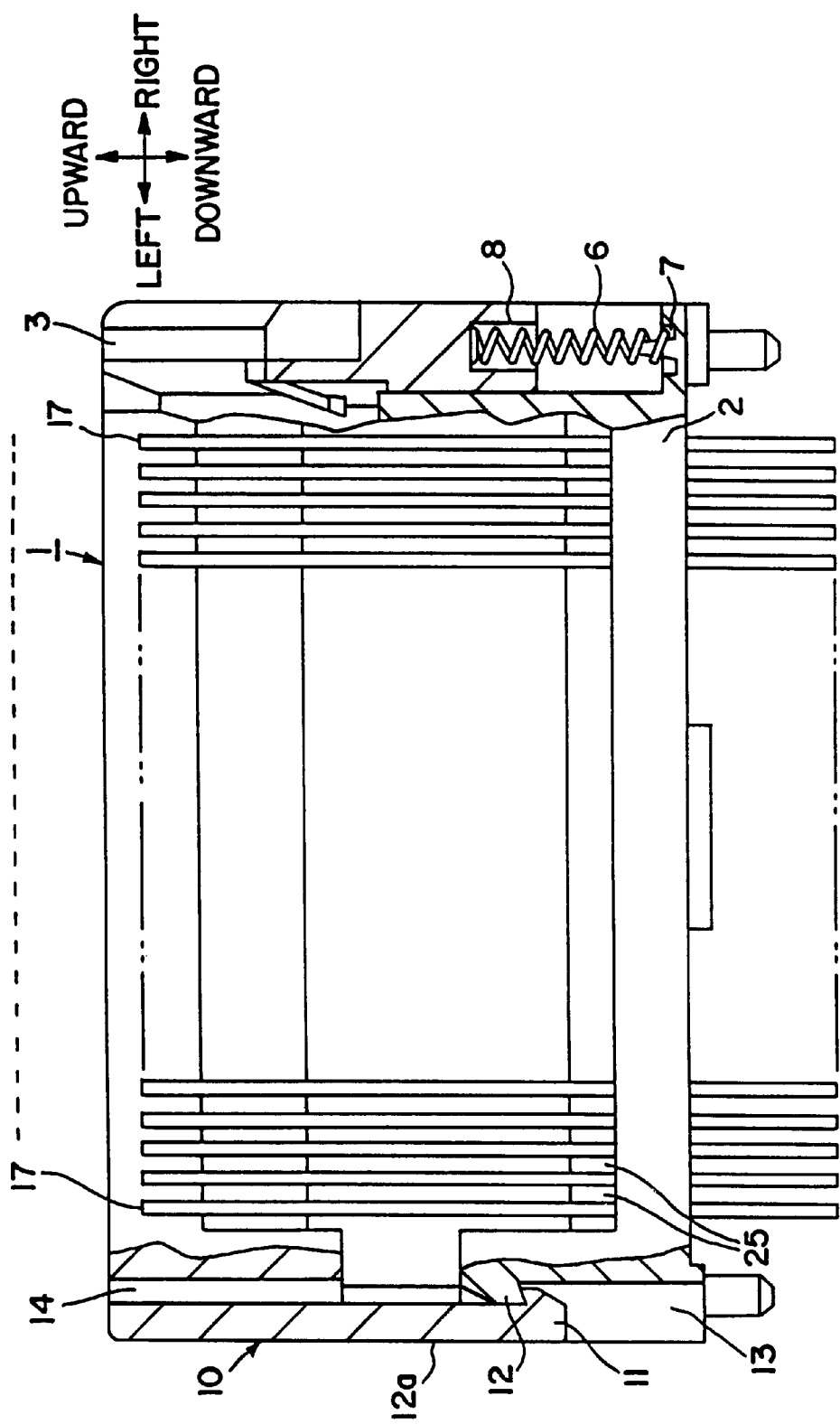
FIG. 4 is a side view showing a partially cutaway part of the IC socket of FIG. 1.

Also, coil springs 6 are provided between the socket main body 2 and the cover 3. More specifically, as shown in FIG. 4, spring attaching holes 7 and 8 are formed on a face, which is opposite to the socket main body 2 and the cover 3, and the end portions of the coil spring 6 are engaged with the spring attaching holes 7 and 8, respectively.

The cover 3 is incorporated into the socket main body 2 to contract the coil springs 6 by a predetermined quantity. Then, the cover 3 is always urged toward the upper portion (upper portion of FIG. 4) of the socket main body 2 by the coil spring 6, and the upper position is positioned by stopper means 10. At least one pair of coil springs 6 is arranged in right and left directions of FIG. 4.

Stopper means 10 comprises claws 11, which are formed at the four corners of cover 3, and claws 12 of the socket main body 2, which are engaged with these claws 11. The claws 11 of cover 3 are engaged to be slidable to the groove 13 formed on the socket main body 2 and the cover 3 is depressed to the lower portion of FIG. 4. At this time, the claws 11 are elastically pushed and expanded along the oblique surfaces of claws 12 of the socket main body 2, and they mount over the claws 12 of the socket main body 2, thereafter engaging with the claws 12 of the socket main body 2. This allows the cover 3 to be incorporated into the socket main body 2.

Figure 18A:
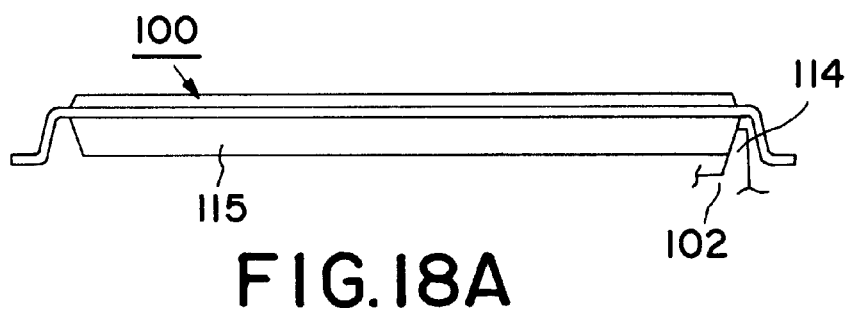
FIG. 18 are front views of IC.
Figure 18B:
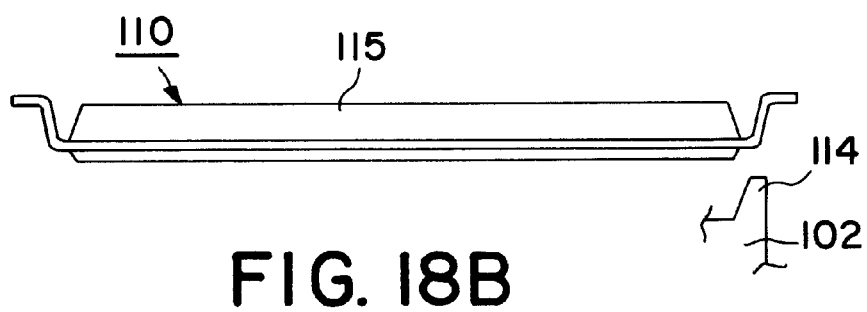
Figure 19:
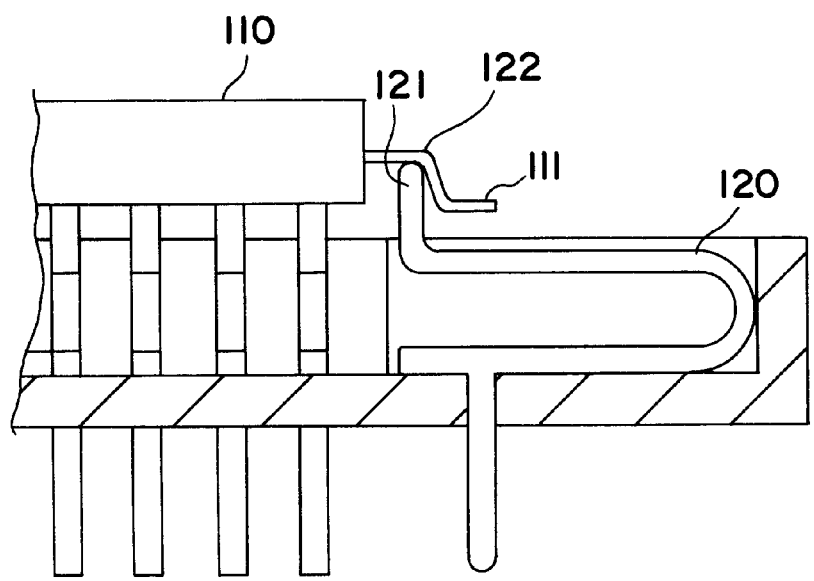
FIG. 19 is a partially cross sectional view of the IC socket showing a second prior art.
Figure 20:
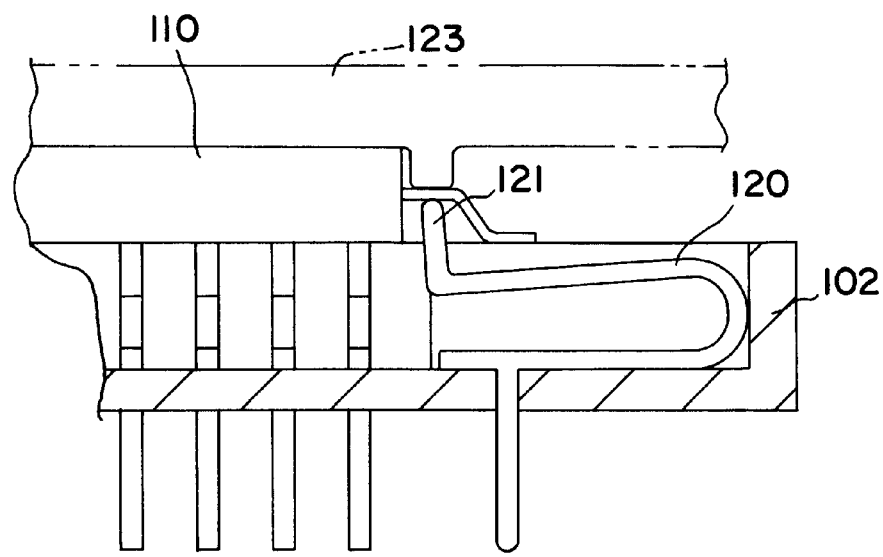
FIG. 20 is a partially cross sectional view of the IC socket showing the actuation operation of the second prior art.
Figure 21:
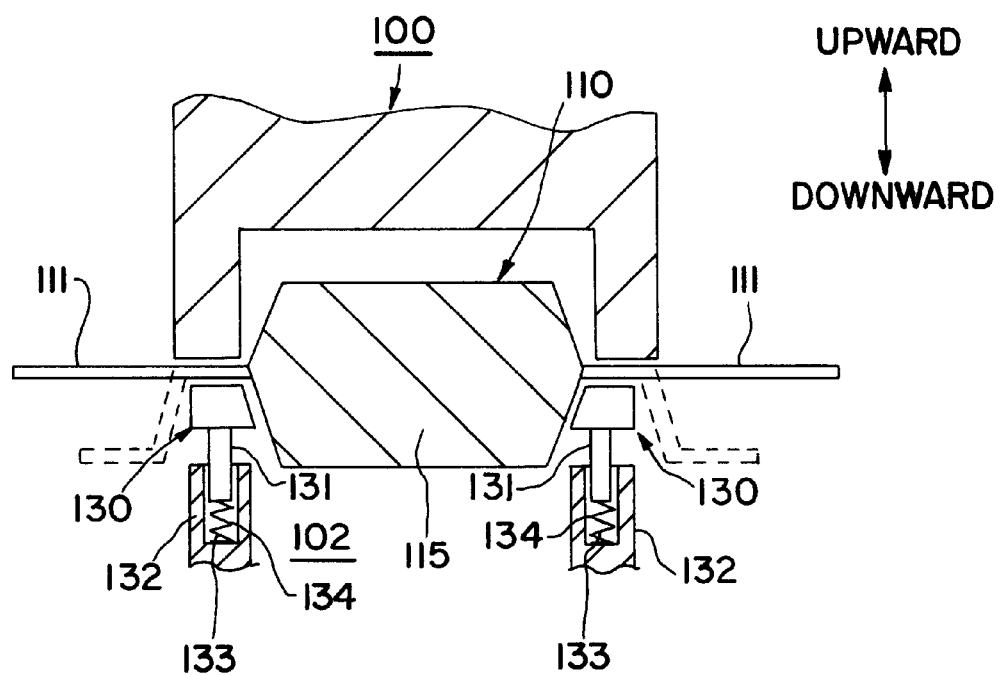
FIG. 21 is a partially cross sectional view of the IC socket showing a third prior art.

Further, a plurality of contact pins 17, which make connection between leads 16 of IC 15 and an external electrical test circuit (not shown), is attached to the socket main body 2. The base portion of these contact pins 17 is engaged with a pin attaching groove 20 of the socket main body 2, and projections 21 and 22 of the base portion 18 are pressed in slits 23 and 24, whereby contact pins 17 are fixed to the socket main body 2. Also, these contact pins 17 are divided not to come in contact with other contact pins 17 adjacent to each other at a rib 25 formed on the socket main body 2. In the contact pins 17, as shown in FIGS. 1 and 18, an connection arm 26, which is projected toward the lower portion of the figure from the base portion 18, is projected to the downward of the socket main body 2. This connection arm 26 is connected to the external electrical test circuit (not shown).

Figure 11:
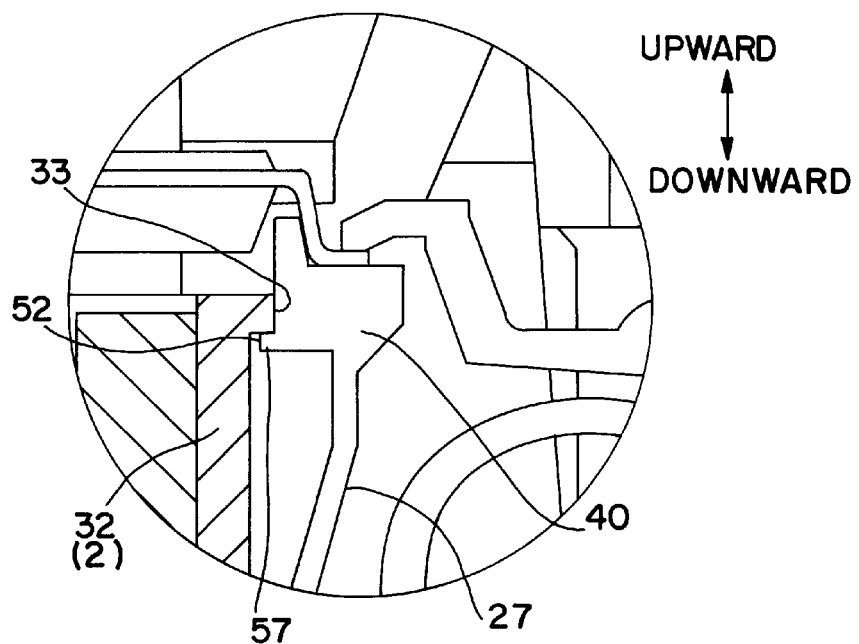
FIG. 11 is a partially enlarged view of the IC socket showing a second application example of the second embodiment of the present invention.

The contact pins 17 are formed of material, which is excellent in conductivity and which has elasticity such as beryllium copper, etc. Then, as shown in FIGS. 1 and 11, there are provided a first contact portion 28, which is connected to the base portion 18 through a first spring 27, and a second contact portion 31, which is connected to the base portion 18 through a second spring 30.

Figure 13:
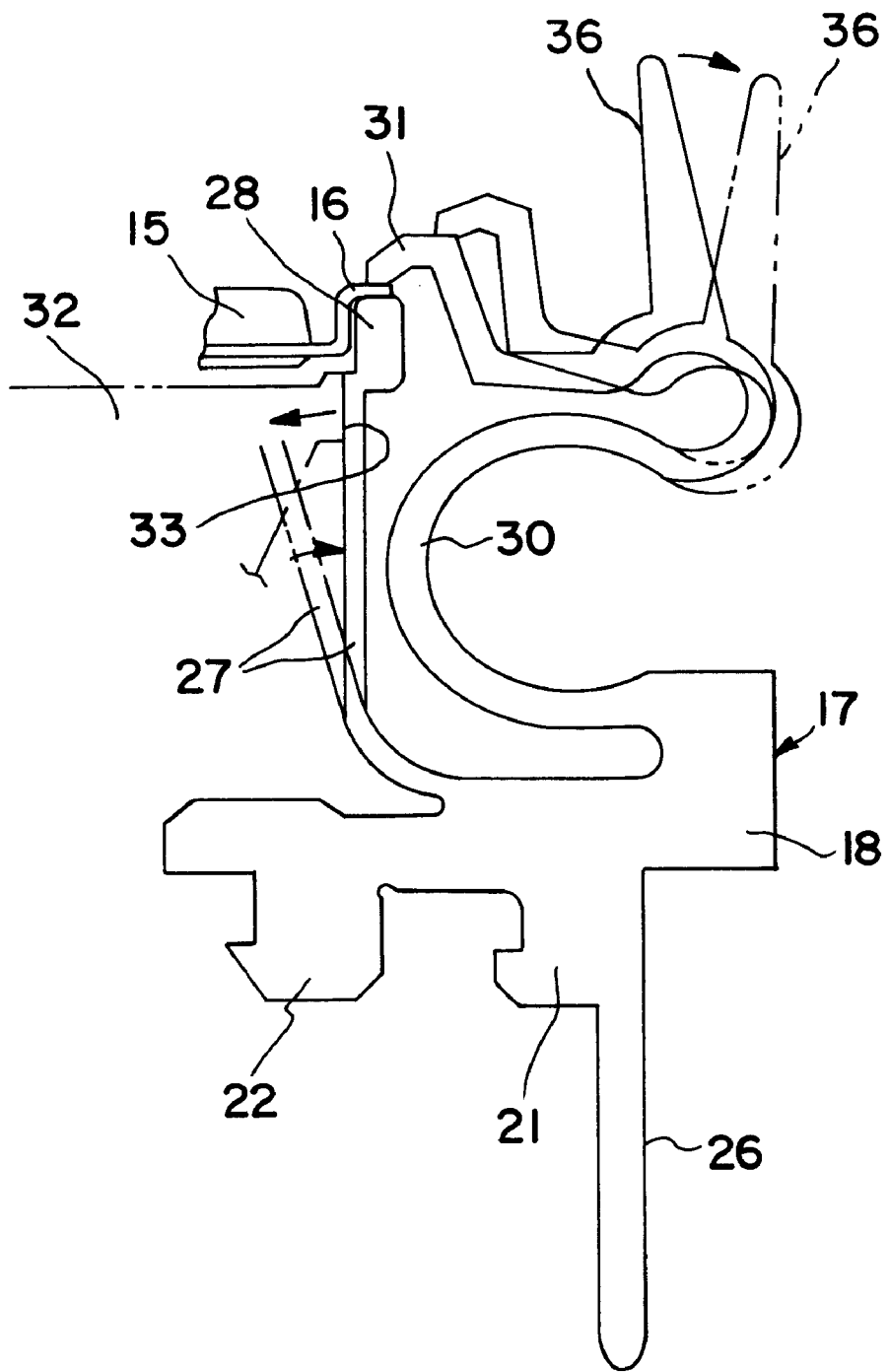
FIG. 13 is an actuation state view of contact pins according to the present invention.
Figure 14:
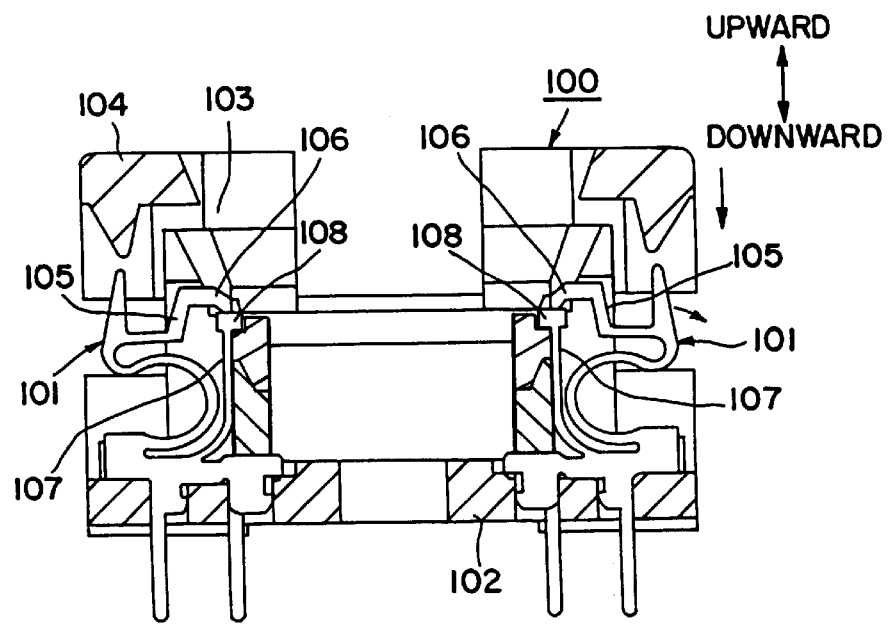
FIG. 14 is a cross sectional view of a front side of a conventional IC socket.
Figure 15:
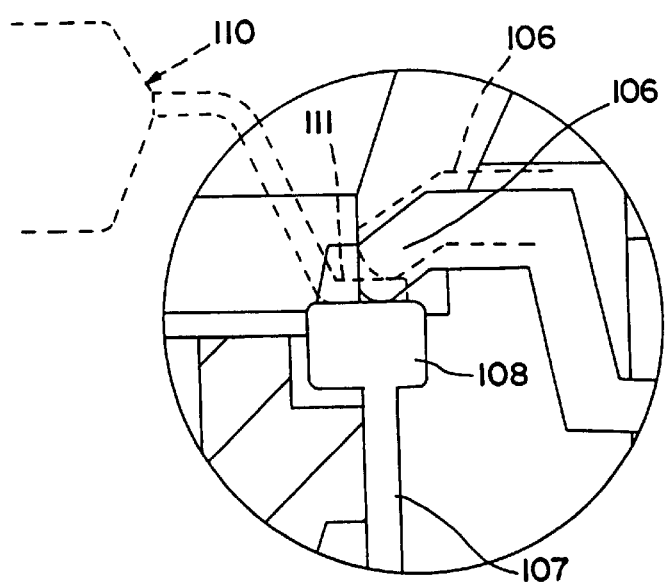
FIG. 15 is a partially enlarged view of the IC socket of FIG. 14.
Figure 16A:
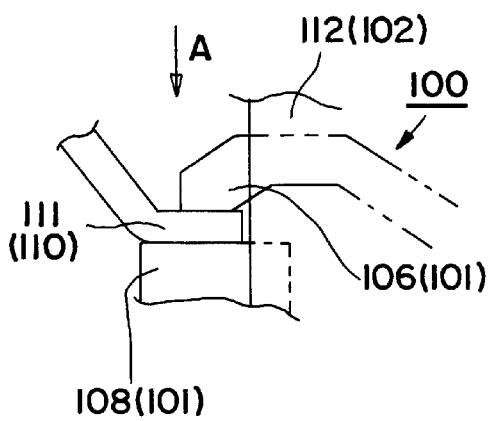
FIG. 16 are enlarged views of the main parts of prior art.
Figure 16B:
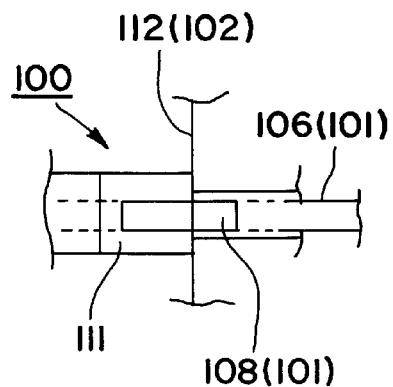
Figure 17A:
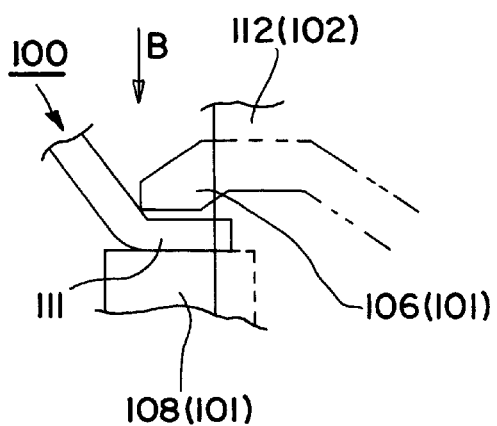
FIG. 17 are enlarged views of the main parts of prior art showing a disadvantageous state.
Figure 17B:
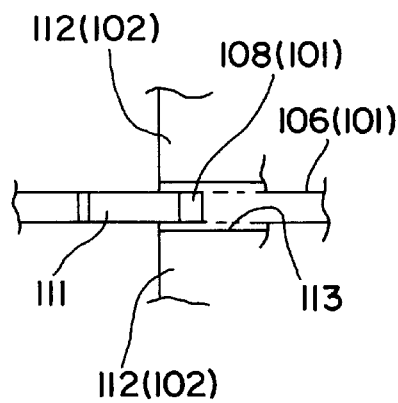

The first spring portion 27 is elastically deformed to a position of a solid line from a position of a two-dotted chain line shown in FIG. 13, and it is brought into contact with a pin support section 33, which is formed on a pin support block 32 of the socket main body 2, under this state. As a result, the first contact portion 28 is pressed to the pin support portion 33 by an elastic force of the first spring portion 27, and is positioned in right and left directions in FIG. 3. A frictional force, which is caused on a contact portion among the first contact portion 28, the first spring portion 27 and the pin support portion 28, is large. For this reason, the first contact portion 28 is not shifted in up and down directions in FIG. 3 with respect to the socket main body 2 even if the second contact portion 31 presses an upper surface 28*a* of the first contact portion 28. In other words, the first contact portion 28 is positioned in the up and down directions and right and left directions with respect to the socket main body 2.

Figure 3:
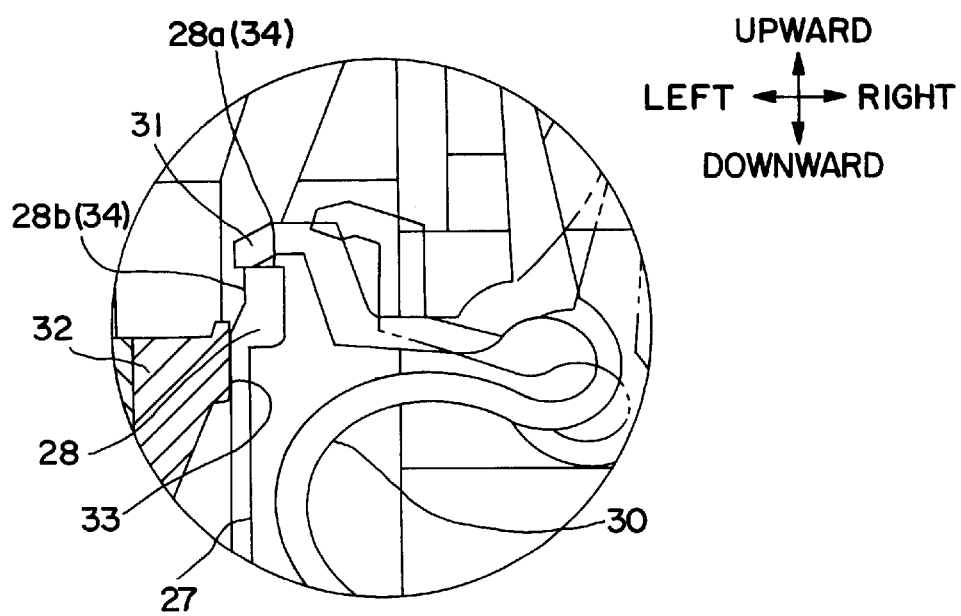
FIG. 3 is a partially enlarged view of the IC socket of FIG. 1.
Figure 5:
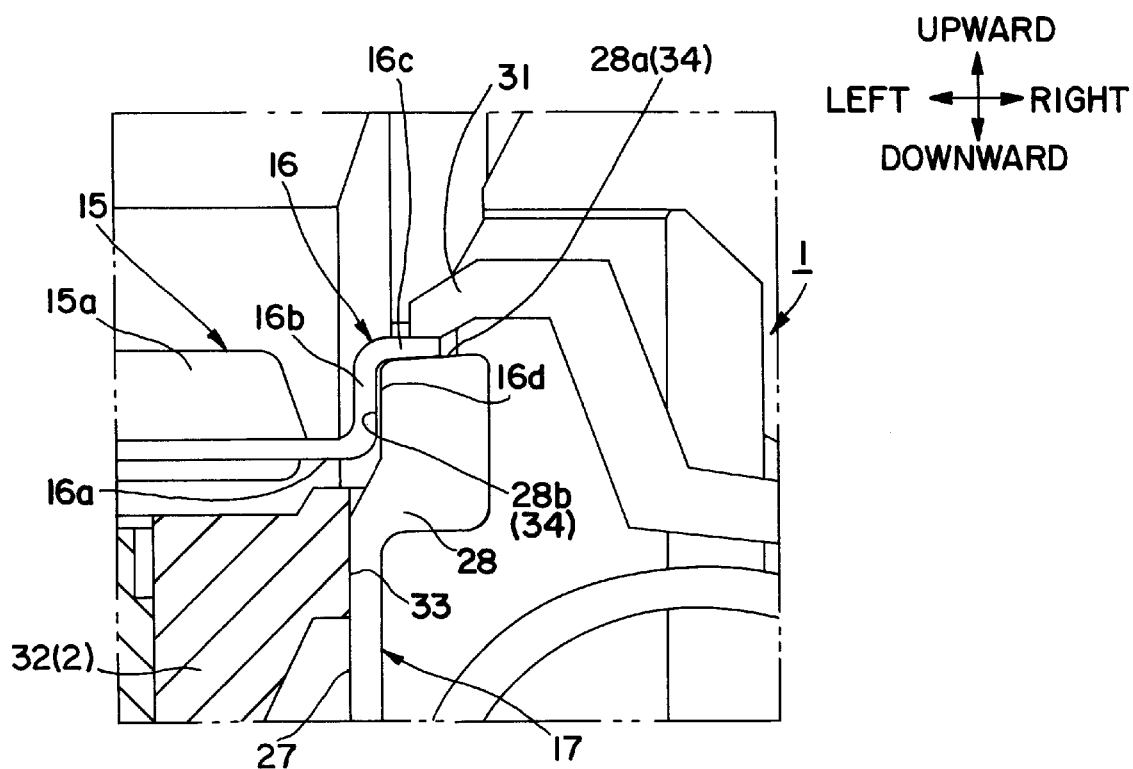
FIG. 5 is a partially enlarged view showing a using state of the IC socket of FIG. 1.

Also, a positioning step portion 34, which is engaged with the lead 16 of IC 15 is formed on the first contact portion 28. As shown in FIGS. 1 and 5, the gull-wing type lead 16 of IC 15 has a first lead portion 16*a*, which projects from a side surface 15*b* of a resin mold 15*a* in substantially a horizontal direction (right and left directions in the figure), a second lead portion 16*b*, which is bent upwardly from the first lead portion 16*a* in the figure, and a third lead portion 16*c*, which is bent from the second lead portion 16*b* in substantially a horizontal direction. Also, as shown in FIGS. 3 and 5, the positioning step portion 34 of the first contact portion 28 has an upper surface (first positioning surface) 28*a* of the first contact portion 28 and a right side surface (second positioning surface) 28*b* thereof. Then, the third lead portion 16*c* of IC 15 is supported by the upper surface 28*a* of the first contact portion 28, and an outer side surface 16*d* of the second lead portion 16b is positioned by the left side surface 28b of the first contact portion 28. As a result, IC 15 is supported and positioned to the socket main body 2 with high accuracy. A slight space is formed between the outer side surface 16d of the second lead portion 16b and the first contact portion 28 in a range that a predetermined positioning accuracy can be ensured so as to consider that the lead 16 of IC 15 can be smoothly engaged with the positioning step portion 34 of the first contact portion 28.

Moreover, as shown in FIGS. 1 and 13, an arm 36 is formed on the upper end portion of the second spring portion 30 to be projected upwardly in the figure. When the cover 3 is depressed against the spring force of the coil springs 6, this arm 36 is pressed by a pressure portion inclined surface 37 of an arc shape formed on the cover 3, and it is displaced to the position of two-dotted chain line of FIGS. 1 and 13.

In this case, the second spring portion 30 is bent and deformed clockwise in FIG. 13. As a result, the second contact portion 31 retracts from the upper surface 28a of the first contact portion 28, and the upper surface 28a of the first contact portion 28 is released. Under this state, IC 15 is inserted to the interior of the cover 3 from an IC insertion window 38 formed on the cover 3, and the lead 16 of IC 15 is engaged with the positioning step portion 34 of the first contact portion 28. As a result, IC 15 is accurately positioned and supported at a predetermined position of the IC socket 1 by the positioning step portion 34 of the first contact portion 28 (FIG. 5).

Thereafter, when the depressing force acting on the cover 3 is released, the cover 3 returns to the original position by the spring force of coil spring 6. As a result, the second spring portion 30 is displaced anticlockwise from the two-dotted chain line of FIG. 13, and the second contact portion 31 presses the lead 16 of IC 15 to the upper surface 28a of the first contact portion 26 by the elastic force of the second spring portion 30. Therefore, the lead 16 of IC 15 is surely sandwiched between the first contact portion 28 and the second contact portion 31 by a predetermined contact pressure (FIG. 5). Then, under this state, the external electrical test circuit (not shown) and IC 15 are electrically connected to each other through contact pins 17 so as to perform the electrical test of IC 15.

Then, when the electrical test of IC 15 ends, the cover 3 is depressed against the spring force of coil spring 6, and the arm 36 is pressed by the pressure portion inclined surface 37 of cover 3. Then, the second spring portion 30 is bent and deformed, and the second contact portion 31 is retracted to the position of two-dotted chain line of FIGS. 1 and 18 from the upper surface of the lead 16. Thereafter, IC 15 is extracted to the outer portion of cover 3 from the IC insertion window 38, and a next electrical test of IC 15 will be performed.

As mentioned above, according to the present invention, the first contact portion 28 of contact pins 17, which support the lead 16, is pressed to the pin support portion 33 by the elastic force of first spring portion 27, so that the first contact portion 28 is positioned to the socket main body 2 by the pin support portion 33. As a result, the positioning step portion 34 formed on the first contact portion 28 is correctly positioned to the socket main body 2. Then, the third lead portion 16c of IC 15 is supported by the upper surface 28a (positioning step portion 34) and the outer side surface 16d of the second lead portion 16b is positioned by the left side surface 28b (positioning step portion 34) of the first contact portion 28. Therefore, IC 15 is supported and positioned to the socket main body 2 with high accuracy.

Accordingly, in this embodiment, IC 15 can be positioned and supported at the predetermined position of IC socket 1 with high accuracy even if IC 15 is inserted to the IC socket in an upside down state (state shown in FIG. 1) and the width of lead 16 is formed to be the same size as that of the contact pin 17 or smaller than that of the contact pin 17. Then, since the lead 16 of IC 15 can be sandwiched between the first contact portion 28 and the second contact portion 31 without fail, the electrical test of IC 15 can be correctly performed.

Also, in this embodiment, the lead 16 of IC 15 is engaged with the positioning step portion 34 formed on the first contact portion 28 of contact pin 17, allowing IC 15 to be positioned and supported at the predetermined position of IC socket 1. This eliminates the need for setting up a block for positioning IC 15 and a complicated positioning mechanism, with the result that upsizing of IC socket 1 and an increase in cost are not caused.

(Second Embodiment)

Figure 6:
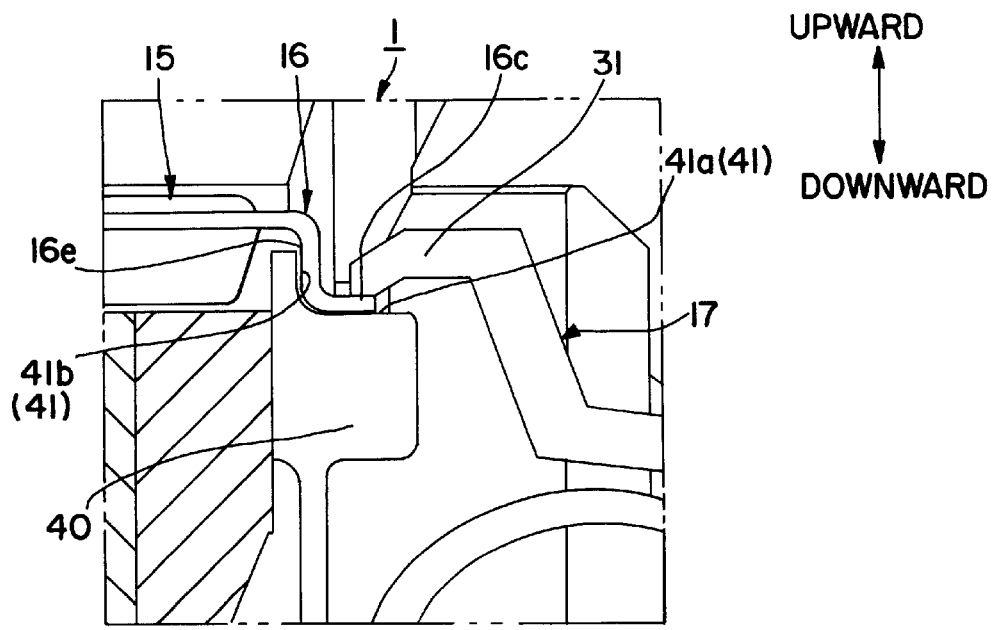
FIG. 6 is a partially enlarged view of an IC socket according to a second embodiment of the present invention.

FIG. 6 is a partially enlarged view of IC socket 1 according to a second embodiment of the present invention. Since the IC socket of this embodiment is the same as that of the first embodiment in the basic structure, the explanation, which overlaps with the first embodiment, is omitted and the second embodiment is described as follows.

In this embodiment, as shown in FIG. 6, when the IC socket 15 is inserted to the IC socket 1, which is opposite in its up and down directions to the case of the first embodiment (FIGS. 1 to 5), a positioning step portion 41 of a first contact portion 40 is engaged with the lead 16 of IC 15, and IC 15 is correctly positioned and supported at a predetermined position of IC socket 1.

Namely, the L-shaped positioning step portion 41 is formed on the first contact portion 40 of contact pins 17. An upper surface (first positioning surface) 41a of this positioning step portion 41 supports the third lead 16c of lead 16. Then, a side surface (second positioning surface) 41b, which rises upwardly from the upper surface 41a in the figure, is engaged with an inner surface 16e of the second lead portion 16b to have a slight space.

Accordingly, in this embodiment, similar to the first embodiment, even if the width of the lead 16 of IC 15 is formed to be the same size as that of the contact pin 17, the lead 16 can be correctly sandwiched between the first contact portion 40 and the second contact portion 31 without fail, and the electrical test of IC 15 can be correctly performed.

Also, in this embodiment, similar to the first embodiment, the lead 16 of IC 15 is engaged with the positioning step portion 41 formed on the first contact portion 40 of contact pin 17, allowing IC 15 to be positioned and supported at the predetermined position of IC socket 1. This eliminates the need for setting up a block for positioning IC 15 and a complicated positioning mechanism, with the result that upsizing of IC socket 1 and an increase in cost are not caused.

(Third Embodiment)

Figure 7:
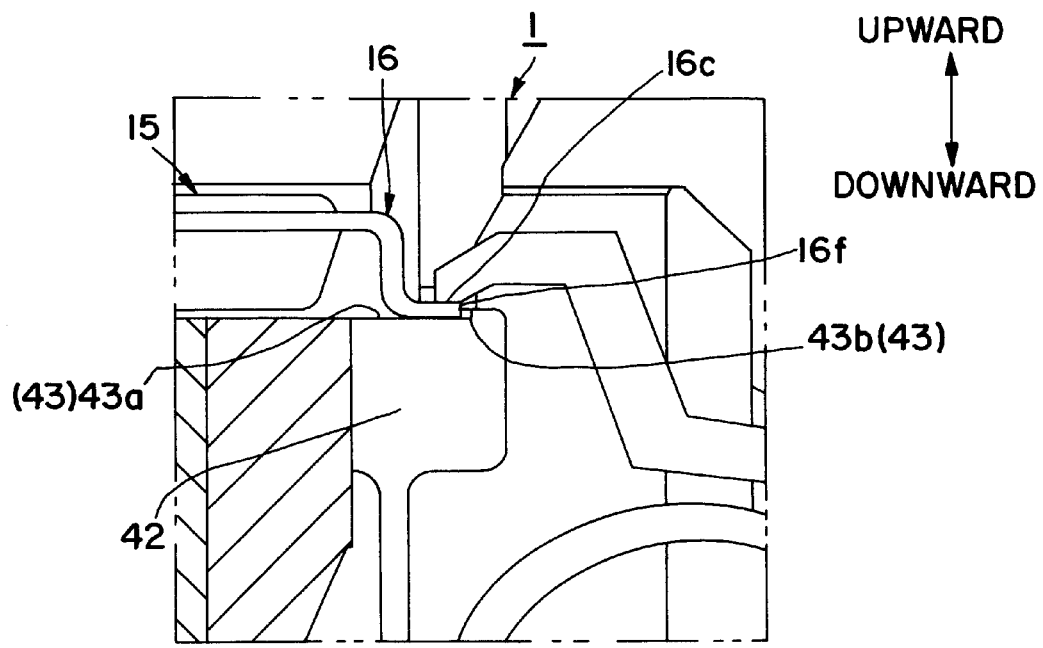
FIG. 7 is a partially enlarged view of an IC socket according to a third embodiment of the present invention.

FIG. 7 is a partially enlarged view of IC socket 1 according to a third embodiment of the present invention. Since the IC socket of this embodiment is the same as that of the first embodiment in the basic structure, the explanation, which overlaps with the first embodiment, is omitted and the third embodiment is described as follows.

In this embodiment, as shown in FIG. 7, when the IC socket 15 is inserted to the IC socket 1, which is opposite in its up and down directions to the case of the first embodiment (FIGS. 1 to 5), a positioning step portion 43 of a first contact portion 42 is engaged with the lead 16 of IC 15, and IC 15 is correctly positioned and supported at a predetermined position of IC socket 1.

Namely, a positioning step portion 43 is formed on the first contact portion 42 of contact pin 17. An upper surface (first positioning surface) 43a of this positioning step portion 43 supports the third lead 16c of lead 16. Then, a side surface (second positioning surface) 43b, which rises upwardly from the upper surface 41a in the figure, is engaged with a tip surface 16f of the third lead portion 16c to have a slight space. Therefore, this embodiment can obtain the same effect as that of the second embodiment.

(Fourth Embodiment)

Figure 8:
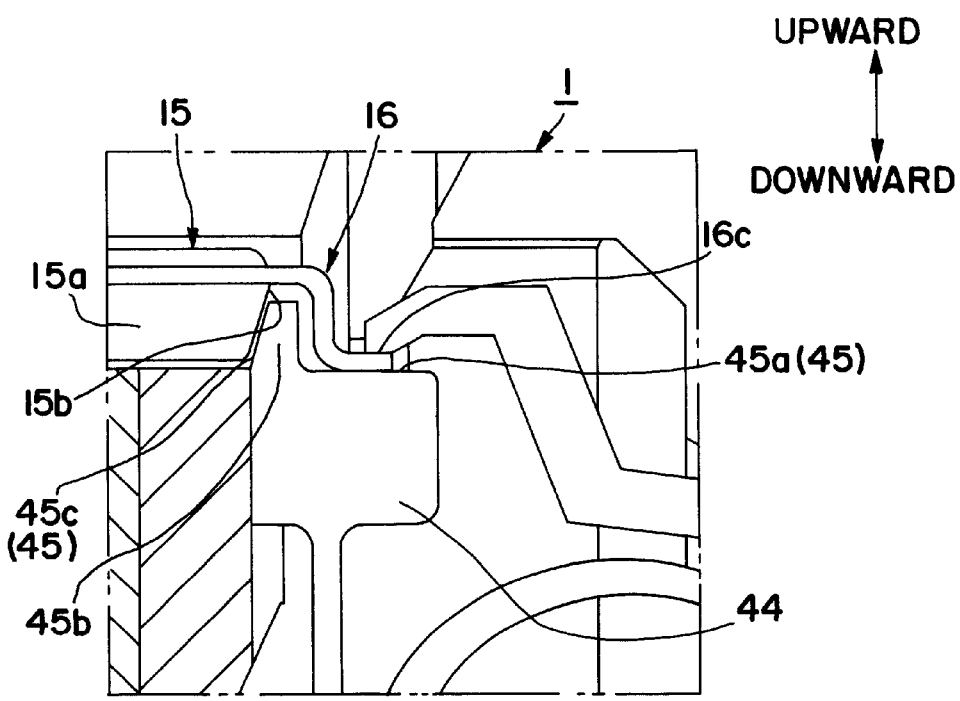
FIG. 8 is a partially enlarged view of an IC socket according to a fourth embodiment of the present invention.

FIG. 8 is a partially enlarged view of IC socket 1 according to a fourth embodiment of the present invention. Since the IC socket of this embodiment is the same as that of the first embodiment in the basic structure, the explanation, which overlaps with the first embodiment, is omitted and the fourth embodiment is described as follows.

In this embodiment, as shown in FIG. 8, when the IC 15 socket is inserted to the IC socket 1, which is opposite in its up and down directions to the case of the first embodiment (FIGS. 1 to 5), a positioning step portion 45 of a first contact portion 44 is engaged with the lead 16 of IC 15 and resin mold, and IC 15 is correctly positioned and supported at a predetermined position of IC socket 1.

Namely, the L-shaped positioning step portion 45 is formed on the first contact portion 44 of contact pin 17. An upper surface (first positioning surface) 45a of this positioning step portion 45 supports the third lead 16c of lead 16. Then, a side surface (second positioning surface) 45c of a convex portion 45b, which rises upwardly from the upper surface 41a in the figure, is engaged with a side surface 15b of resin mold to have a slight space. Therefore, this embodiment can obtain the same effect as that of the second embodiment.

(Fifth Embodiment)

Figure 9:
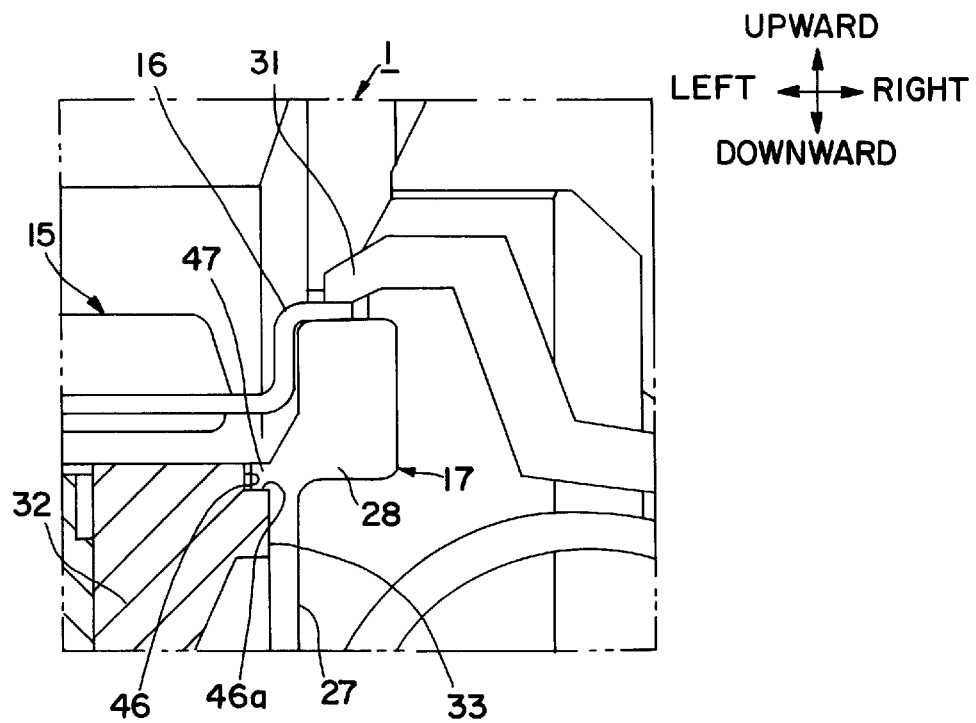
FIG. 9 is a partially enlarged view of an IC socket according to a fifth embodiment of the present invention.

FIG. 9 is a partially enlarged view of IC socket 1 according to a fourth embodiment of the present invention. Since the IC socket of this embodiment shows an application example of the first embodiment and is the same as that of the first embodiment in the basic structure, the explanation, which overlaps with the first embodiment, is omitted and the fifth embodiment is described as follows.

Namely, In this embodiment, a concave portion 46 is formed on an upper side surface, which is opposite to the first contact portion 28 of the pin support block 32. A convex portion 47 formed on the lower end side surface of the first contact portion 28 is engaged with the concave portion 46. Then, the first contact portion 28 and the upper end portion side are pressed to the pin support portion 33 by the spring force of the first spring portion 27. Also, the convex portion 47 is pressed to a bottom surface 46a of the concave portion 46 by the spring force of the first spring portion 27.

According to the above-structured embodiment, the first contact portion 28 can be positioned and supported in up and down directions of FIG. 9 and right and left directions without fail. For this reason, accuracy in the support position of the lead 16 of each contact pin 17 can be improved and accuracy in the positioning of IC 15 can be improved, with the result that the lead 16 of IC 15 can be sandwiched between the first contact portion 28 and the second contact portion 31.

Moreover, since accuracy in the support position of the lead 16 of each contact pin 17 can be improved as mentioned above, deformation resulting from variations in the lead support position can be effectively prevented from being generated even if the lead 16 is formed of soft material.

(Sixth Embodiment)

Figure 10:
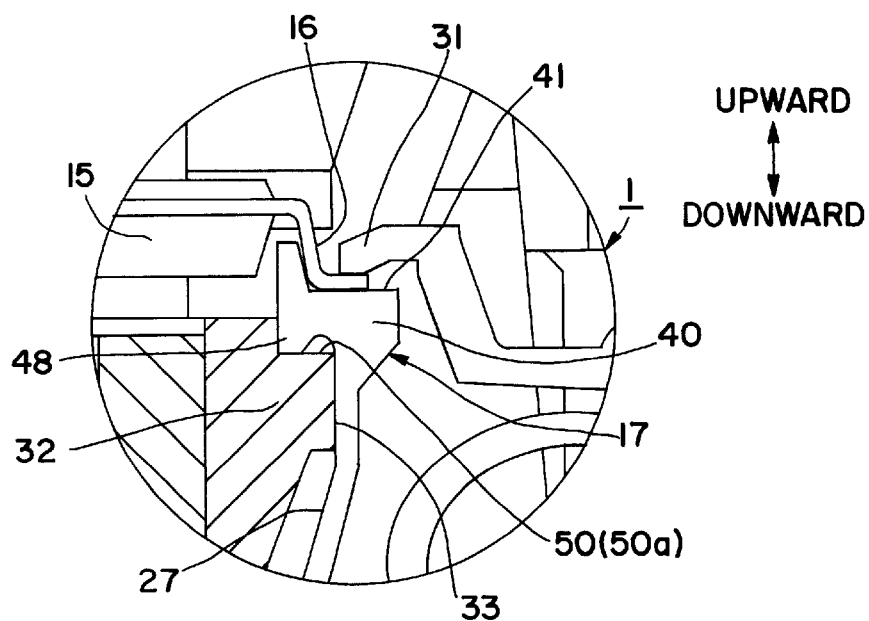
FIG. 10 is a partially enlarged view of the IC socket showing a first application example of the second embodiment of the present invention.

FIG. 10 is a partially enlarged view of IC socket 1 according to a sixth embodiment of the present invention. Since the IC socket of this embodiment shows an application example of the second embodiment and is the same as that of the first embodiment in the basic structure, the explanation, which overlaps with the second embodiment, is omitted and the sixth embodiment is described as follows.

Namely, according this embodiment, in the first contact portion 40 having the positioning step portion 41 formed thereon, a convex portion 48 is formed on the lower end portion of pin support block 32. On the other hand, a concave portion 50, which is engaged with the convex portion 48 of the first contact portion 40, is formed on the upper end portion of the side opposite to the contact pin 17 of pin support block 32. Then, the first contact portion 40 and the upper end portion side of the first spring portion 27 are pressed to the pin support portion 33 by the spring force of the first spring portion 27. Also, the convex portion 48 is pressed to a bottom surface 50a of a concave portion 50 by the spring force of the first spring portion 27.

According to the above-structured embodiment, the first contact portion 40 can be positioned and supported in up and down directions of FIG. 10 and right and left directions without fail. For this reason, accuracy in the support position of the lead 16 of each contact pin 17 can be improved and accuracy in the positioning of IC 15 can be improved, with the result that the lead 16 of 1C 15 can be more surely sandwiched between the first contact portion 40 and the second contact portion 31.

Moreover, since accuracy in the support position of the lead 16 of each contact pin 17 can be improved as mentioned above, deformation resulting from variations in the lead support position can be effectively prevented from being generated even if the lead 16 is formed of soft material.

The structure in which the first contact portion 40 is positioned to the socket main body 2 (pin support block 32) is not limited to the embodiment shown in FIG. 10. As shown in. FIG. 11, a convex portion 51 formed on the first contact portion 40 is engaged with a step portion 52 formed on the pin support block 32. Then, the first contact portion 40 is pressed to the pin support portion 33 by the spring force of the first spring portion 27 and the convex portion 51 is pressed to the step portion 52, whereby the first contact portion 40 may be positioned and supported to the socket main body 2.

Figure 12:
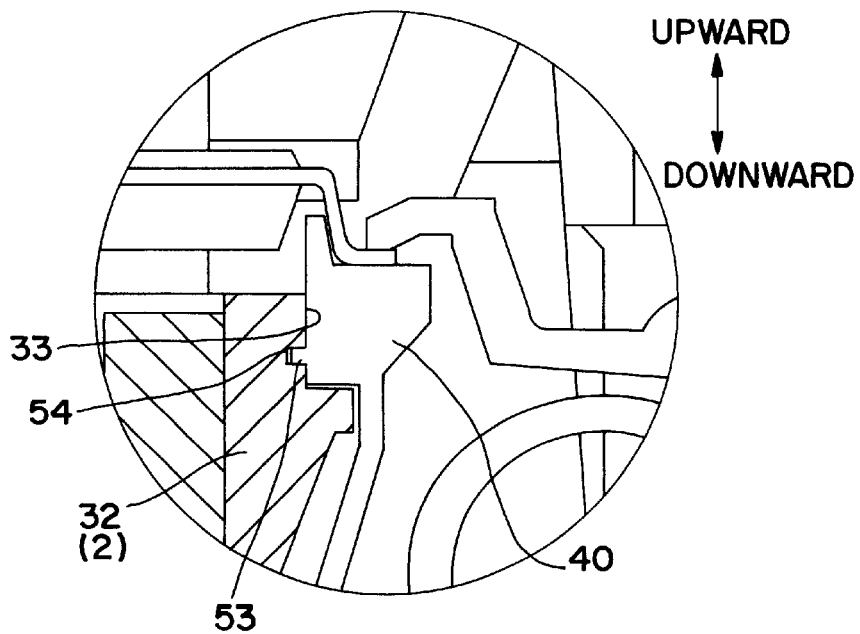
FIG. 12 is a partially enlarged view of the IC socket showing a third application example of the second embodiment of the present invention.

Moreover, as shown in FIG. 12, a convex portion 53 formed on the side surface of the first contact portion 40 is engaged with a concave portion 54 formed on the pin support block 32, and the first contact portion 40 is pressed to the pin support portion 33 by the spring force of the first spring portion 27. Also, the convex portion 53 is pressed to either one of upper and lower surfaces of the concave portion 54, whereby the first contact portion 40 may be positioned and supported to the socket main body 2.

Further, this embodiment can be applied to the third and fourth embodiments.

In addition, each embodiment shows the specific form in which the first contact portion is pressed to the pin support portion by the spring force of the first spring portion. However, the present invention is not limited to the above. The first contact portion is engaged with the socket main body and supported, whereby the first contact portion may be positioned to the socket main body.

Thus, according to the present invention, the first contact portion of the contact pin, which supports the lead, is positioned by the pin support portion of the socket main body. For this reason, When the lead of IC is engaged with the positioning step portion formed on this first contact portion, IC is positioned and supported with respect to the socket main body with high accuracy. Moreover, according to the present invention, when the lead is positioned and supported by the positioning step portion formed on the first contact portion of the contact pin, or IC is inserted to the IC socket in an upside down state, or the width of the lead is formed to be the same as that of the contact pin, the IC is positioned and supported at the predetermined position of the IC socket with high accuracy. Therefore, according to the present invention, the lead of IC can be sandwiched between the first contact portion and the second contact portion without fail, and the electrical test of IC can be performed more correctly than prior art.

Further, according to the present invention, the lead of IC is engaged with the positioning step portion formed on the first contact portion of the first pin as mentioned above, allowing IC to be positioned and supported at the predetermined position of IC socket. This eliminates the need for setting up a block for positioning IC and a complicated positioning mechanism, with the result that upsizing of IC socket and an increase in cost are not caused.

What is claimed is:

1. An IC socket comprising:.
a socket main body for elastically supporting a cover having an IC insertion window formed thereon to be movable up and down; and
a plurality of contact pins, which are attached to said socket main body, for connecting gull-wing shaped leads taken out of a side surface of an IC resin mold to an external electrical test circuit,
each of said contact pins comprising:
a base portion fixed to said socket main body;
a first contact portion, which is extended from said base portion, for supporting corresponding one of said leads in a state that it is positioned by a pin support portion formed on said socket main body; and
a second contact portion, which is connected to said base portion through a spring portion, for bending and deforming said spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said spring portion when said cover returns to an original position, whereby performing an electrical connection,
wherein a positioning step portion, which is engaged with said one of said leads and the side surface of said IC resin mold to position said IC, is formed on said first contact portion.

2. An IC socket comprising:
a socket main body for elastically supporting a cover having an IC insertion window formed thereon to be movable up and down; and
a plurality of contact pins, which are attached to said socket main body, for connecting gull-wing shaped leads taken out of a side surface of an IC resin mold to an external electrical test circuit,
each of said contact pins comprising:
a base portion fixed to said socket main body;
a first contact portion, which is connected to said base portion through a first spring portion, for supporting corresponding one of said leads; and
a second contact portion, which is connected to said base portion through a second spring portion, for bending and deforming said second spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said second spring portion when said cover returns to an original position, whereby performing an electrical connection,
wherein a pin support portion, which comes in contact with said first contact portion urged by a spring force of said first spring portion to position said first contact portion, is formed on said socket main body, and a positioning step portion, which is engaged with said one of said leads and the side surface of said IC resin mold to position said IC, is formed on said first contact portion.

3. An IC socket comprising:
a socket main body for elastically supporting a cover having an IC insertion window formed thereon to be movable up and down; and
a plurality of contact pins, which are attached to said socket main body, for connecting gull-wing shaped leads taken out of a side surface of an IC resin mold to an external electrical test circuit,
each of said contact pins comprising:
a base portion fixed to said socket main body;
a first contact portion, which is extended from said base portion, for supporting corresponding one of said leads in a state that it is positioned by a pin support portion formed on said socket main body; and
a second contact portion, which is connected to said base portion through a spring portion, for bending and deforming said spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said spring portion when said cover returns to an original position, whereby performing an electrical connection,
wherein a positioning step portion, which is engaged with said one of said leads to position said IC, is formed on said first contact portion,
wherein each of said leads has a first lead portion, which projects substantially horizontally from the side surface of said resin mold, a second lead portion, which is bent from said first lead portion, said second lead portion having an outer side surface thereof, and a third lead portion, which is bent substantially horizontally from said second lead portion, and said positioning step portion has a first positioning surface, which supports said third lead portion, and a second positioning surface, which is engaged with the outer side surface of said second lead portion.

4. An IC socket comprising:
a socket main body for elastically supporting a cover having an IC insertion window formed thereon to be movable up and down; and a plurality of contact pins, which are attached to said socket main body, for connecting gull-wing shaped leads taken out of a side surface of an IC resin mold to an external electrical test circuit, each of said contact pins comprising:

a base portion fixed to said socket main body;

a first contact portion, which is connected to said base portion through a first spring portion, for supporting corresponding one of said leads; and a second contact portion, which is connected to said base portion through a second spring portion, for bending and deforming said second spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said second spring portion when said cover returns to an original position, whereby performing an electrical connection, wherein a pin support portion, which comes in contact with said first contact portion urged by a spring force of said first spring portion to position said first contact portion, is formed on said socket main body, and a positioning step portion, which is engaged with said one of said leads to position said IC, is formed on said first contact portion, wherein each of said leads has a first lead portion, which projects substantially horizontally from the side surface of said resin mold, a second lead portion, which is bent from said first lead portion, said second lead portion having an outer side surface thereof, and a third lead portion, which is bent substantially horizontally from said second lead portion, and said positioning step portion has a first positioning surface, which supports said third lead portion, and a second positioning surface, which is engaged with the outer side surface of said second lead portion.

5. An IC socket comprising:

a socket main body for elastically supporting a cover having an IC insertion window formed thereon to be movable up and down; and a plurality of contact pins, which are attached to said socket main body, for connecting gull-wing shaped leads taken out of a side surface of an IC resin mold to an external electrical test circuit, each of said contact pins comprising:

a base portion fixed to said socket main body;

a first contact portion, which is extended from said base portion, for supporting corresponding one of said leads in a state that it is positioned by a pin support portion formed on said socket main body; and a second contact portion, which is connected to said base portion through a spring portion, for bending and deforming said spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said spring portion when said cover returns to an original position, whereby performing an electrical connection, wherein a positioning step portion, which is engaged with said one of said leads to position said IC, is formed on said first contact portion, wherein each of said leads has a first lead portion, which projects substantially horizontally from the side surface of said resin mold, a second lead portion, which is bent from said first lead portion, said second lead portion having an inner side surface thereof, and a third lead portion, which is bent substantially horizontally from said second lead portion, and said positioning step portion has a first positioning surface, which supports said third lead portion, and a second positioning surface, which is engaged with the inner side surface of said second lead portion.

6. An IC socket comprising:

a socket main body for elastically supporting a cover having an IC insertion window formed thereon to be movable up and down; and a plurality of contact pins, which are attached to said socket main body, for connecting gull-wing shaped leads taken out of a side surface of an IC resin mold to an external electrical test circuit, each of said contact pins comprising:

a base portion fixed to said socket main body;

a first contact portion, which is connected to said base portion through a first spring portion, for supporting corresponding one of said leads; and a second contact portion, which is connected to said base portion through a second spring portion, for bending and deforming said second spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said second spring portion when said cover returns to an original position, whereby performing an electrical connection, wherein a pin support portion, which comes in contact with said first contact portion urged by a spring force of said first spring portion to position said first contact portion, is formed on said socket main body, and a positioning step portion, which is engaged with said one of said leads to position said IC, is formed on said first contact portion, wherein each of said leads has a first lead portion, which projects substantially horizontally from the side surface of said resin mold, a second lead portion, which is bent from said first lead portion, said second lead portion having an inner side surface thereof, and a third lead portion, which is bent substantially horizontally from said second lead portion, and said positioning step portion has a first positioning surface, which supports said third lead portion, and a second positioning surface, which is engaged with the inner side surface of said second lead portion.

7. An IC socket comprising:

a socket main body for elastically supporting a cover having an IC insertion window formed thereon to be movable up and down; and a plurality of contact pins, which are attached to said socket main body, for connecting gull-wing shaped leads taken out of a side surface of an IC resin mold to an external electrical test circuit, each of said contact pins comprising:

a base portion fixed to said socket main body;

a first contact portion, which is extended from said base portion, for supporting corresponding one of said leads in a state that it is positioned by a pin support portion formed on said socket main body; and a second contact portion, which is connected to said base portion through a spring portion, for bending and deforming said spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said spring portion when said cover returns to an original position, whereby performing an electrical connection, wherein a positioning step portion, which is engaged with said one of said leads to position said IC, is formed on said first contact portion, wherein each of said leads has a first lead portion, which projects substantially horizontally from the side surface of said resin mold, a second lead portion, which is bent from said first lead portion, and a third lead portion, which is bent substantially horizontally from said second lead portion, said third lead portion having a tip surface thereof and said positioning step portion has a first positioning surface, which supports said third lead portion, and a second positioning surface, which is engaged with the tip surface of the third lead portion.

8. An IC socket comprising:

a socket main body for elastically supporting a cover having an IC insertion window formed thereon to be movable up and down; and a plurality of contact pins, which are attached to said socket main body, for connecting gull-wing shaped leads taken out of a side surface of an IC resin mold to an external electrical test circuit, each of said contact pins comprising:

a base portion fixed to said socket main body;

a first contact portion, which is connected to said base portion through a first spring portion, for supporting corresponding one of said leads; and a second contact portion, which is connected to said base portion through a second spring portion, for bending and deforming said second spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said second spring portion when said cover returns to an original position, whereby performing an electrical connection, wherein a pin support portion, which comes in contact with said first contact portion urged by a spring force of said first spring portion to position said first contact portion, is formed on said socket main body, and a positioning step portion, which is engaged with said one of said leads to position said IC, is formed on said first contact portion, wherein each of said leads has a first lead portion, which projects substantially horizontally from the side surface of said resin mold, a second lead portion, which is bent from said first lead portion, and a third lead portion, which is bent substantially horizontally from said second lead portion, said third lead portion having a tip surface thereof and said positioning step portion has a first positioning surface, which supports said third lead portion, and a second positioning surface, which is engaged with the tip surface of the third lead portion.

9. The IC socket according to claim 1, wherein each of said leads has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the side surface of said resin mold.

10. The IC socket according to claim 2, wherein each of said leads has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the side surface of said resin mold.

11. For use in an IC socket having contact pins, which are attached to a socket main body, which elastically supports a cover having an IC insertion window formed thereon to be movable up and down, for connecting gull-wing shaped leads taken out of a side surface of an IC resin mold to an external electrical test circuit, each of said contact pins comprising:

a base portion fixed to said socket main body;

a first contact portion, which is extended from said base portion, for supporting corresponding one of said leads in a state that it is positioned by a pin support portion formed on said socket main body; and a second contact portion, which is connected to said base portion through a spring portion, for bending and deforming said spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said spring portion when said cover returns to an original position, whereby performing an electrical connection, wherein a positioning step portion, which is engaged with said one of said leads and the side surface of said IC resin mold to position said IC, is formed on said first contact portion.

12. The IC socket according to claim 11, wherein each of said leads has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the side surface of said resin mold.

13. The IC socket according to claim 11, wherein each of said leads has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the outer side surface of said second lead portion.

14. The IC socket according to claim 11, wherein each of said leads has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the inner side surface of said second lead portion.

15. The IC socket according to claim 11, wherein each of said lead has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the tip surface of the third lead portion.

16. For use in an IC socket having contact pins, which are attached to a socket main body, which elastically supports a cover having an IC insertion window formed thereon to be movable up and down, for connecting gull-wing shaped leads taken out of a side surface of an IC resin mold to an external electrical test circuit, each of said contact pins comprising:

a base portion fixed to said socket main body;

a first contact portion, which is connected to said base portion through a first spring portion and which is pressed to a pin support portion formed on said socket main body by a spring force of said first spring portion so as to be positioned, for supporting corresponding one of said leads; and a second contact portion, which is connected to said base portion through a second spring portion, for bending and deforming said second spring portion by being pressed by said cover when said cover is depressed, and for guiding said one of said IC leads onto said first contact portion after retracting from said first contact portion, and for sandwiching said one of said leads between said first contact portion and said second contact portion by an elastic restoring force of said second spring portion when said cover returns to an original position, whereby performing an electric connection, wherein a positioning step portion, which is engaged with said one of said leads and the side surface of said IC resin mold to position said IC, is formed on said first contact portion.

17. The IC socket according to claim 16, wherein each of said leads has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the side surface of said resin mold.

18. The IC socket according to claim 16, wherein each of said leads has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the outer side surface of said second lead portion.

19. The IC socket according to claim 16, wherein each of said leads has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the inner side surface of said second lead portion.

20. The IC socket according to claim 16, wherein each of said lead has a first lead portion, which projects substantially horizontally from the side surface of said resin mold, a second lead portion, which is bent from said first lead portion, and a third lead portion, which is bent substantially horizontally from said second lead portion, and said positioning step portion has a first positioning surface, which supports said third lead portion, and a second positioning surface, which is engaged with the tip surface of the third lead portion.

\* \* \* \* \*